United States Patent
Lee

(10) Patent No.: US 11,011,569 B2
(45) Date of Patent: May 18, 2021

(54) IMAGE SENSOR INCLUDING A PLURALITY OF TRANSFER TRANSISTORS COUPLED BETWEEN PHOTODIODE AND FLOATING DIFFUSION REGION

(71) Applicant: SK hynix Inc., Icheon-si (KR)

(72) Inventor: Jae Won Lee, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/600,164

(22) Filed: Oct. 11, 2019

(65) Prior Publication Data

US 2020/0411583 A1    Dec. 31, 2020

(30) Foreign Application Priority Data

Jun. 25, 2019    (KR) .................. 10-2019-0075939

(51) Int. Cl.
| | | |
|---|---|---|
| *H01L 27/146* | (2006.01) | |
| *H04N 5/378* | (2011.01) | |
| *H04N 5/3745* | (2011.01) | |
| *H04N 5/351* | (2011.01) | |

(52) U.S. Cl.
CPC .. *H01L 27/14641* (2013.01); *H01L 27/14605* (2013.01); *H01L 27/14614* (2013.01); *H04N 5/351* (2013.01); *H04N 5/378* (2013.01); *H04N 5/3745* (2013.01)

(58) Field of Classification Search
CPC ......... H01L 27/14641; H01L 27/14605; H01L 27/14614; H04N 5/3745; H04N 5/351; H04N 5/378
See application file for complete search history.

(56) References Cited

U.S. PATENT DOCUMENTS

| | | | |
|---|---|---|---|
| 2004/0190360 A1 | 9/2004 | Scheuerlein | |
| 2011/0073923 A1* | 3/2011 | Tatani | ................. H01L 27/1463 257/291 |
| 2011/0320688 A1 | 12/2011 | Lee | |
| 2013/0047132 A1 | 2/2013 | Kim et al. | |

(Continued)

FOREIGN PATENT DOCUMENTS

| | | |
|---|---|---|
| KR | 10-1105635 | 1/2012 |
| KR | 10-2014-0015292 | 2/2014 |

(Continued)

OTHER PUBLICATIONS

Non-Final Office Action dated Oct. 29, 2020 for U.S. Appl. No. 16/666,220 (14 pages).

*Primary Examiner* — Ahmed A Berhan
(74) *Attorney, Agent, or Firm* — Perkins Coie LLP

(57) ABSTRACT

An image sensor includes a pixel group comprising a plurality of photodiodes configured to produce photocharges produced in response to light incident on the plurality of photodiodes, a floating diffusion region configured to receive and accumulate the photocharges produced by the plurality of photodiodes, a plurality of transfer transistors coupled to the plurality of photodiodes, respectively, each of the plurality of transfer transistors configured to transfer the photocharges produced by the corresponding photodiode, and a common transfer transistor coupled between the plurality of transfer transistors and the floating diffusion region and configured to transfer the photocharges produced by the plurality of photodiodes to the floating diffusion region.

19 Claims, 10 Drawing Sheets

(56) References Cited

U.S. PATENT DOCUMENTS

| | | |
|---|---|---|
| 2013/0308401 A1 | 11/2013 | Yang |
| 2015/0169247 A1 | 6/2015 | Wang et al. |
| 2015/0187436 A1 | 7/2015 | Querbach et al. |
| 2016/0125956 A1 | 5/2016 | Magia et al. |
| 2016/0343454 A1 | 11/2016 | Pachamuthu et al. |
| 2016/0343770 A1* | 11/2016 | Fan .................... H01L 27/14843 |
| 2019/0267103 A1 | 8/2019 | Jung et al. |

FOREIGN PATENT DOCUMENTS

| | | |
|---|---|---|
| KR | 1020160061673 A | 6/2016 |
| KR | 1020180059208 A | 6/2018 |

* cited by examiner

IMAGE SENSOR INCLUDING A PLURALITY OF TRANSFER TRANSISTORS COUPLED BETWEEN PHOTODIODE AND FLOATING DIFFUSION REGION

CROSS-REFERENCES TO RELATED APPLICATION

This patent document claims the priority and benefits of Korean Patent Application No. 10-2019-0075939 filed on Jun. 25, 2019 in the Korean Intellectual Property Office, which is incorporated herein by reference in its entirety.

TECHNICAL FIELD

The technology and implementations disclosed in this patent document relate to an image sensor device and an imaging pixel structure.

BACKGROUND

An image sensor is a device that captures light from an optical image or one or more objects by using the property of a photosensitive semiconductor element that converts incident light into an electrical signal. Recently, with the development of automotive, medical, computer, and communication industries, the demand for high-performance image sensors is increasing in various devices such as smartphones, digital cameras, game machines, devices that operate using the Internet of Things, robots, security cameras and medical micro cameras.

One common type of image sensor is a charge coupled device (CCD). Another common type of image sensing device is a complementary metal oxide semiconductor (CMOS) image sensor. CCD image sensors have advantages over the CMOS image sensor in terms of noise characteristics and image quality. However, CMOS image sensors are now widely used due to certain advantages over the CCD counterparts, including, e.g., higher frame rates and shutter speed. Also, CMOS image sensors and signal processing circuitry may be integrated into a single chip, making it easy to miniaturize a product and consume very low power. Further, using the CMOS process technology may result in lower manufacturing costs. Such characteristics of CMOS image sensors make these sensors better suited for implementation in mobile devices.

SUMMARY

This patent document, among other features and benefits, relates to image sensing devices that include a common transfer transistor coupled between multiple transfer transistors and the corresponding floating diffusion regions to effectively transfer photo-charges to the floating diffusion regions.

In an embodiment, an image sensor may include a pixel group comprising a plurality of photodiodes configured to produce photocharges produced in response to light incident on the plurality of photodiodes, a floating diffusion region configured to receive and accumulate the photocharges produced by the plurality of photodiodes, a plurality of transfer transistors coupled to the plurality of photodiodes, respectively, each of the plurality of transfer transistors configured to transfer the photocharges produced by the corresponding photodiode, and a common transfer transistor coupled between the plurality of transfer transistors and the floating diffusion region and configured to transfer the photocharges produced by the plurality of photodiodes to the floating diffusion region.

In another embodiment, an image sensor may include a pixel group comprising first to fourth photodiodes configured to produce photocharges in response to light incident thereon, first to fourth transfer transistors configured to transfer photocharges accumulated in the first to fourth photodiodes, respectively, and a common transfer transistor coupled between the first to fourth transfer transistors and a floating diffusion region, and configured to transfer the photocharges to the floating diffusion region. A logic low level voltage or a logic high level voltage applied to the first to fourth transfer transistors to turn on or off the first to fourth transfer transistors is different from a logic low level voltage or a logic high level voltage applied to the common transfer transistor to turn on or off the common transfer voltage.

In another embodiment, an image sensor may include a pixel array including a pixel group including first to fourth unit pixels and a row decoder configured to drive the pixel array. The first unit pixel comprises a first transfer transistor and a common transfer transistor which are coupled between a first photodiode that is configured to accumulate photocharges in correspondence to an intensity of incident light and a floating diffusion region.

In an embodiment, an image sensor may include: a pixel group including: first to fourth photodiodes each configured to accumulate photocharges converted in correspondence to an intensity of incident light; a floating diffusion configured to receive and accumulate the photocharges; first to fourth transfer transistors coupled with the first to fourth photodiodes, respectively, and each configured to transfer the photocharges; and a common transfer transistor coupled between the first to fourth transfer transistors and the floating diffusion, and configured to transfer the photocharges to the floating diffusion.

The floating diffusion may be disposed at a center portion of the first to fourth photodiodes.

The common transfer transistor may have a ring shape to surround the floating diffusion.

The common transfer transistor may include first to fourth sub transfer transistors which are disposed to surround the floating diffusion.

A gate electrode of the common transfer transistor may be electrically isolated from gate electrodes of the respective first to fourth transfer transistors.

A voltage of a low level which is applied to the common transfer transistor may be different from a voltage of a low level which is applied to the respective first to fourth transfer transistors.

A voltage of a high level which is applied to the common transfer transistor may be different from a voltage of a high level which is applied to the respective first to fourth transfer transistors.

In a reset operation for the first photodiode, the first transfer transistor may be turned on by a first transfer control signal of a first high level, and the common transfer transistor may be turned on by a common transfer control signal of a second high level higher than the first high level.

In the reset operation for the first photodiode, a potential difference by first potential may be induced between the first transfer transistor which has potential lower than the first photodiode and the common transfer transistor which has potential higher than the floating diffusion.

The first potential may be determined in consideration of photocharge accumulation capacity of the floating diffusion.

In the reset operation for the first photodiode, the common transfer transistor may transfer photocharges existing between the floating diffusion and the respective second to fourth transfer transistors, to the floating diffusion.

In a photocharge accumulation operation for the first photodiode, the first transfer transistor may be turned off by the first transfer control signal of a second low level, and the common transfer transistor may be turned off by the common transfer control signal of a first low level higher than the second low level.

In the photocharge accumulation operation for the first photodiode, a potential difference by second potential may be induced between the first transfer transistor and the common transfer transistor which have potential higher than the first photodiode.

The second potential may be determined in consideration of photocharge accumulation capacity of the first photodiode.

In a photocharge transfer operation for the first photodiode, the first transfer transistor may be turned on by the first transfer control signal of the first high level, and the common transfer transistor may be turned on by the common transfer control signal of the second high level higher than the first high level.

The shared pixel may include first to fourth unit pixels which are disposed at 2×2.

The first to fourth unit pixels may share a reset transistor, a drive transistor and a selection transistor.

In an embodiment, an image sensor may include: a shared pixel including: first to fourth transfer transistors configured to transfer photocharges accumulated in first to fourth photodiodes, respectively; and a common transfer transistor coupled between the first to fourth transfer transistors and a floating diffusion, and configured to transfer the photocharges to the floating diffusion, wherein a voltage of a low level or a voltage of a high level which is applied to the first to fourth transfer transistors is different from a voltage of a low level or a voltage of a high level which is applied to the common transfer transistor.

In a photocharge accumulation operation for the first photodiode, the first transfer transistor may be turned off by the first transfer control signal of a second low level, and the common transfer transistor may be turned off by the common transfer control signal of a first low level higher than the second low level.

In an embodiment, an image sensor may include: a pixel array including a shared pixel which is configured by first to fourth unit pixels; and a row decoder configured to drive the pixel array, wherein the first unit pixel includes a first transfer transistor and a common transfer transistor which are coupled in series between a first photodiode accumulating photocharges converted in correspondence to an intensity of incident light and a floating diffusion.

According to the embodiments disclosed in the present document, by dividing a transfer transistor performing photocharge transfer between a photodiode and a floating diffusion, into two transfer transistors, and independently controlling bias voltages to be applied to the respective transfer transistors, advantages may be provided in that pixel operation characteristics may be improved when resetting the floating diffusion, accumulating photocharges and transferring photocharges to the floating diffusion, the noise of a pixel signal may be reduced and power consumption may be minimized.

DETAILED DESCRIPTION

Hereinafter, various embodiments of the present technology will be disclosed with reference to the accompanying drawings. However, the description is not intended to limit the present disclosure to particular embodiments, and it should be construed as including various modifications, equivalents, and/or alternatives according to the embodiments of the present disclosure.

Figure 1:
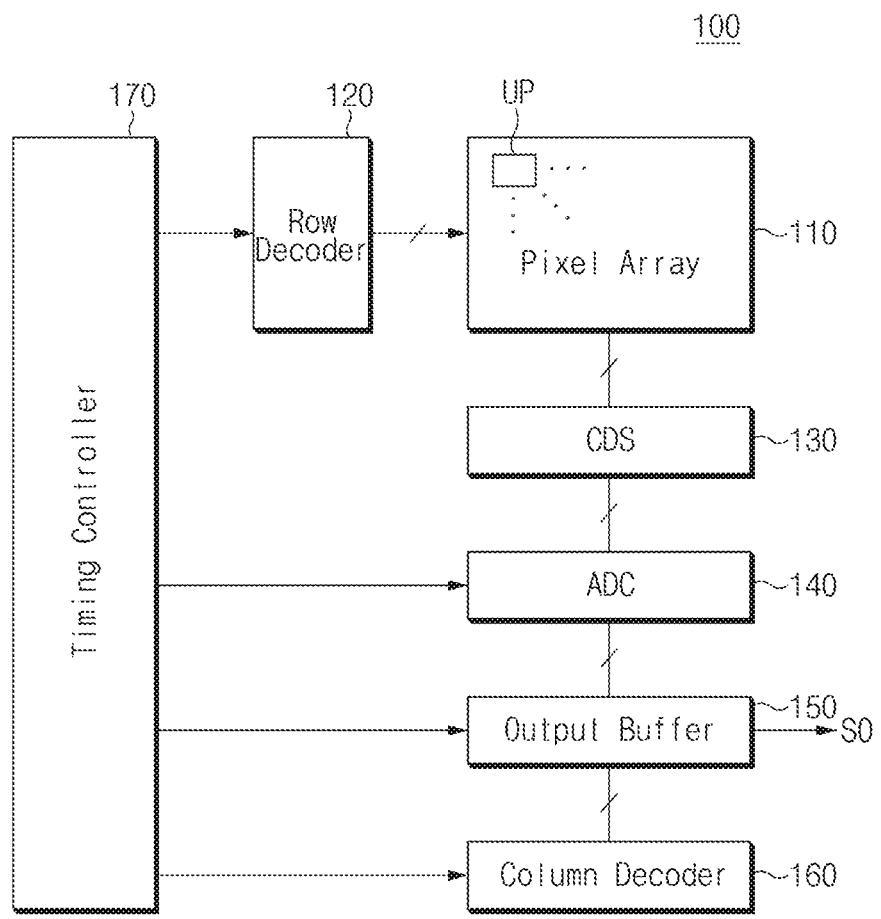
FIG. 1 illustrates an example of an image sensor based on an embodiment of the disclosed technology.

FIG. 1 illustrates an example of an image sensor based on an embodiment of the disclosed technology.

By way of example and not by limitation, an image sensor 100 may include a pixel array 110, a row decoder 120, a correlated double sampler (CDS) 130, an analog-digital converter (ADC) 140, an output buffer 150, a column decoder 160, and a timing controller 170.

The pixel array 110 may include a plurality of unit pixels UP arranged in rows and columns where two or more pixels are grouped together to form a pixel group. In some embodiments of the disclosed technology, the plurality of unit pixels (e.g., unit pixels constituting a pixel group 200 in FIG. 2) may convert optical signals into electrical signals on a pixel group basis where at least two unit pixels in the same pixel group share at least one common element such as a floating diffusion region. The pixel array 110 may receive control signals such as a row select signal, a pixel reset signal and a transfer signal, from the row decoder 120, and may operate based on the control signals.

The row decoder 120 may be used to select one or more pixels of the pixel array 110 according to timings provided by the timing controller 170. In some implementations, the row decoder 120 may select at least one row among a plurality of rows arranged in the pixel array 110 by generating the row select signal. The row decoder 120 may sequentially enable the pixel reset signal and the transfer signal with respect to pixels that are coupled to the selected at least one row. Upon enabling the pixel reset signal and the transfer signal, a reference signal and an analog image signal generated from each of the pixels corresponding to the selected row are sequentially transferred to the correlated double sampler 130. Here, the reference signal and the image signal may be collectively referred to as a pixel signal.

The correlated double sampler 130 may sequentially sample and hold a reference signal and an image signal provided to each of a plurality of column lines from the pixel array 110. In other words, the correlated double sampler 130 may sample and hold the voltage levels of a reference signal and an image signal corresponding to each of the columns of the pixel array 110.

The correlated double sampler 130 may transfer a reference signal and an image signal of each of the columns to the ADC 140 as a correlated double sampling signal under the control of the timing controller 170.

The CMOS image sensor may use the correlated double sampling (CDS) to remove an undesired offset value of pixels by sampling a pixel signal twice to remove the difference between these two samples. In one example, the correlated double sampling (CDS) may remove the undesired offset value of pixels by comparing pixel output voltages obtained before and after a light signal is incident on the pixels so that only pixel output voltages based on the incident light can be measured.

The ADC 140 may convert, for each of the columns, an analog pixel signal that has removed the offset value by using the correlated double sampling through the correlated double sampler 130, into a digital signal. Examples of the ADC 140 may include a ramp-compare type ADC where the analog pixel signal is compared a ramp signal that ramps up or down and a timer counts until a voltage of the ramp signal matches the analog pixel signal. In one example, the analog pixel signal that has removed the offset value by a correlated double sampling is compared with a ramp signal provided from the timing controller 170 to generate digital image data from which noise corresponding to each column (e.g., reset noise specific to each pixel) is removed.

The ADC 140 may include a plurality of column counters corresponding to the columns of the pixel array 110, respectively, and may convert the offset-removed signals corresponding to the columns, respectively, into digital signals, by using the column counters. In some embodiments of the disclosed technology, the ADC 140 may include one global counter, and may convert the offset-removed signals corresponding to each of the columns into a digital signal by using a global code provided from the global counter.

The output buffer 150 may capture and output image data of each column unit provided from the ADC 140. The output buffer 150 may temporarily store image data outputted from the ADC 140, according to timings provided by the timing controller 170. The output buffer 150 may operate as an interface which compensates for a difference in transfer (or processing) speed between the image sensor 100 and another device connected thereto.

The column decoder 160 may select a column of the output buffer 150 according to the timings provided by the timing controller 170, and image data temporarily stored in the selected column of the output buffer 150 may be sequentially outputted. In one example, the column decoder 160 may, upon receipt of an address signal from the timing controller 170, select a column of the output buffer 150 by generating a column select signal based on the address signal to output image data as an output signal SO from the selected column of the output buffer 150.

The timing controller 170 may control the row decoder 120, the ADC 140, the output buffer 150, and the column decoder 160.

The timing controller 170 may provide a clock signal required for the operation of each component of the image sensor 100, a control signal for timing control and address signals for selecting a row or a column, to the row decoder 120, the column decoder 160, the ADC 140 and the output buffer 150. In some embodiments of the disclosed technology, the timing controller 170 may include a logic control circuit, a phase locked loop (PLL) circuit, a timing control circuit and a communication interface circuit.

Figure 2:
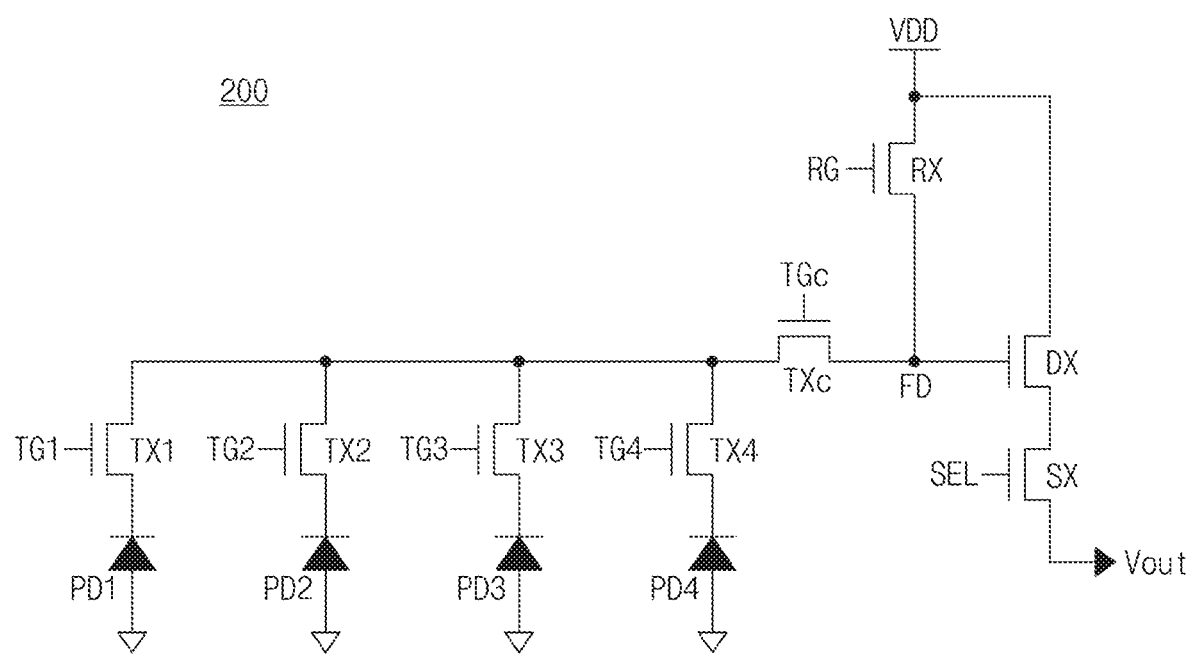
FIG. 2 illustrates an example of a pixel group that includes two or more pixels in a pixel array illustrated in FIG. 1.

FIG. 2 illustrates an example of a pixel group that includes two or more unit pixels in the pixel array illustrated in FIG. 1.

As shown in FIG. 2, a pixel group 200 may include four unit pixels. That is to say, the pixel group 200 may include four unit pixels (e.g., four photodiodes PD1 to PD4 and four transfer transistors TX1 to TX4 where each unit pixel includes one photodiode and one transfer transistor), and the remaining elements are structured to be shared by the four unit pixels (e.g., four photodiodes PD1 to PD4 and the four transfer transistors TX1 to TX4).

In an implementation, the pixel group 200 may include first to fourth photodiodes PD1 to PD4, first to fourth transfer transistors TX1 to TX4, a common transfer transistor TXc, a floating diffusion (floating diffusion region) FD, a reset transistor RX, a drive transistor DX, and a selection transistor SX. In the context of this patent document, a transfer transistor may indicate a transistor or other components that can be used to transfer the accumulated charge on the photodiodes to the floating diffusion region.

Each of the first to fourth photodiodes PD1 to PD4 may, based on incident light, generate photocharges corresponding to an amount of the incident light. Each of the first to fourth photodiodes PD1 to PD4 is an example of a photoelectric conversion element. In various embodiments of the disclosed technology, the photoelectric conversion element may include a phototransistor, a photogate, a pinned photodiode or a combination thereof.

The respective first to fourth transfer transistors TX1 to TX4 may be coupled between the respective first to fourth photodiodes PD1 to PD4 and the common transfer transistor TXc. The respective first to fourth transfer transistors TX1 to TX4 may be turned on or off in response to first to fourth transfer control signals TG1 to TG4 corresponding thereto, respectively, and a turned-on transfer transistor may transfer photocharges, accumulated in a corresponding photodiode, to the common transfer transistor TXc.

The common transfer transistor TXc may be coupled between the respective first to fourth transfer transistors TX1 to TX4 and the floating diffusion FD. The common transfer transistor TXc may be turned on or off in response to a common transfer control signal TGc, and the turned-on common transfer transistor TXc may transfer photocharges, transferred from each of the first to fourth transfer transistors TX1 to TX4, to the floating diffusion FD.

The floating diffusion FD may accumulate photocharges of each of the first to fourth photodiodes PD1 to PD4, which are transferred through the common transfer transistor TXc. The floating diffusion FD may be formed on a junction capacitor.

The reset transistor RX may be coupled between a power supply voltage VDD and the floating diffusion FD, and may reset the voltage level of the floating diffusion FD to the power supply voltage VDD in response to a reset control signal RG.

The drive transistor DX may amplify the voltage at the floating diffusion FD which receives photocharges generated by the first to fourth photodiodes PD1 to PD4, and may transfer the amplified voltage to the selection transistor SX; thus, for example, the drive transistor DX may operate as a source follower transistor.

The selection transistor SX may select a pixel group to be read one a row basis. The selection transistor SX may be turned on in response to a selection control signal SEL, and a signal corresponding to electrical charges at the floating diffusion FD, which is provided to the drain (i.e., the source of the source follower transistor) of the selection transistor SX, may be outputted as an output voltage Vout.

In some implementations, the output voltage Vout of the selection transistor SX may correspond to the reference signal (i.e., a signal corresponding to the floating diffusion FD in a reset state) or the image signal (i.e., a voltage at the floating diffusion FD in a state in which photocharges transferred from the photodiodes PD1 to PD4 are accumulated) described above with reference to FIG. 1.

Figure 3:
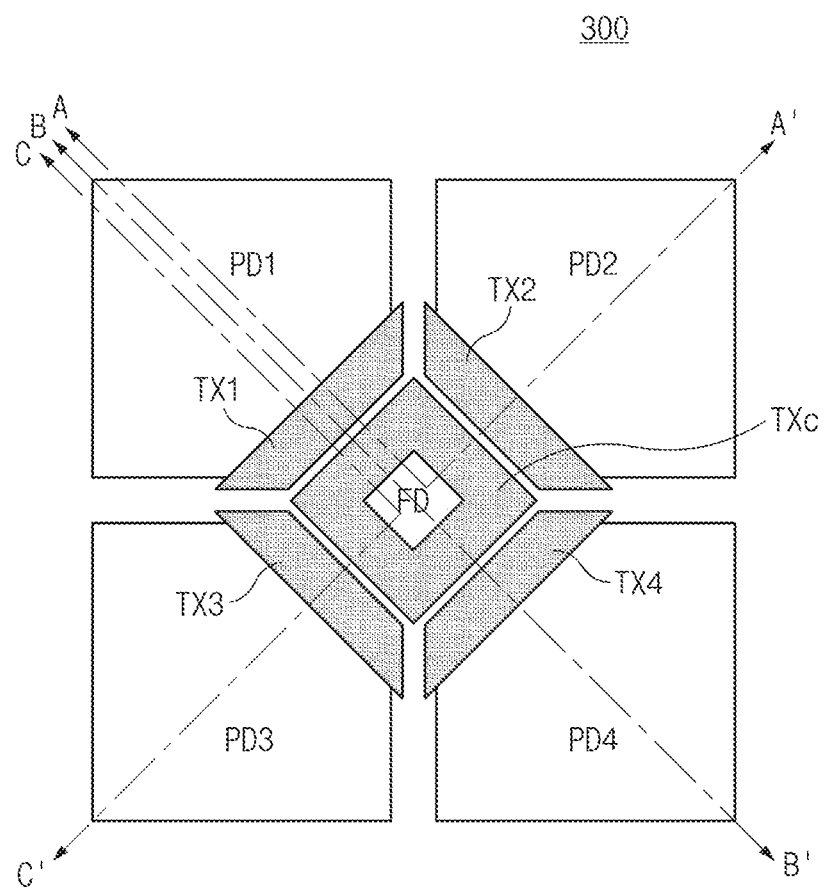
FIG. 3 illustrates an example layout of the pixel group illustrated in FIG. 2.

FIG. 3 illustrates an example layout of the pixel group illustrated in FIG. 2.

Referring to FIG. 3, a pixel group 300 may include four unit pixels (e.g., photodiodes and transfer transistors).

While the four unit pixels (e.g., four photodiodes and four transfer transistors) illustrated in FIG. 3 are arranged in the form of a 2×2 matrix, they can be arranged in different ways such as 1×4 or 4×1 matrix.

The floating diffusion FD may be disposed at the center between four unit pixels, and the common transfer transistor TXc may be disposed to surround the perimeter of the floating diffusion FD. For example, the common transfer transistor TXc may have a ring shape or any polygonal shape. Between the respective sides of the common transfer transistor TXc and the respective photodiodes PD1 to PD4, the respective transfer transistors TX1 to TX4 may be disposed to extend along the respective sides of the common transfer transistor TXc.

At least a portion of each of the photodiodes PD1 to PD4 may be exposed to increase light reception efficiency, and the other elements RX, DX and SX not illustrated in FIG. 3 may be disposed in the upper, lower, left and/or right peripheral region (not illustrated) of the photodiodes PD1 to PD4.

By way of example and not by limitation, the respective photodiodes PD1 to PD4 and the respective transfer transistors TX1 to TX4 or the common transfer transistor TXc and the floating diffusion FD may at least partially overlap with each other.

Three directions A-A', B-B' and C-C' illustrated in FIG. 3 may indicate directions that extend from the first photodiode PD1 through the floating diffusion FD to the second to fourth photodiodes PD2 to PD4, respectively. Since cross-sections corresponding to the respective directions A-A', B-B' and C-C' have substantially the same structure, the cross-section along the first direction A-A' will be described with reference to FIG. 4.

Although it will be described with reference to FIGS. 3 and 4 for the sake of convenience in explanation that the respective transfer transistors TX1 to TX4 and TXc are disposed, the respective transfer transistors TX1 to TX4 and TXc can indicate the gates of the respective transfer transistors TX1 to TX4 and TXc.

Figure 4:
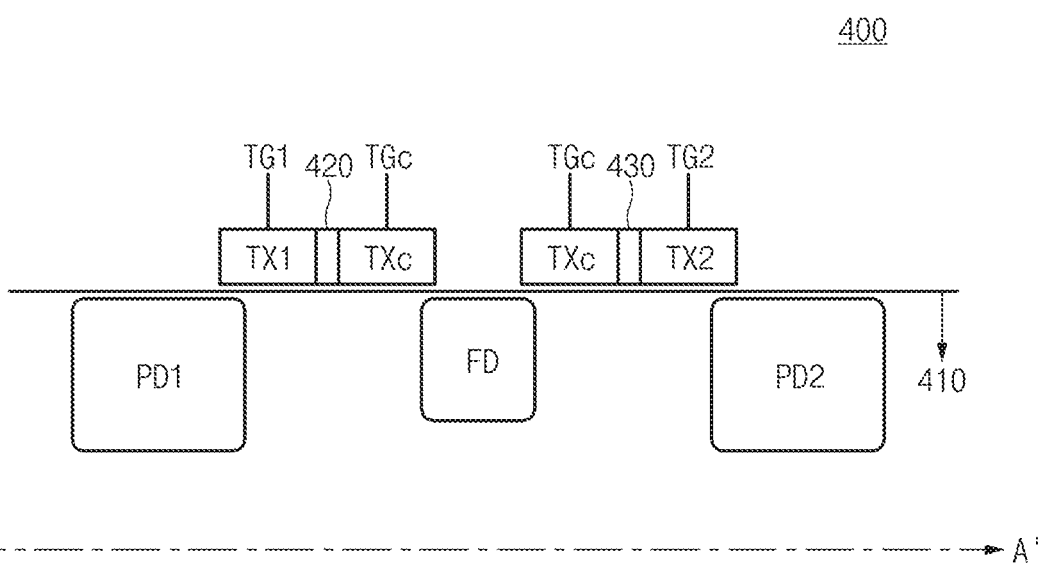
FIG. 4 is a cross-sectional view taken along a first direction A-A' of FIG. 3, illustrating an example of the pixel group.

FIG. 4 is a cross-sectional view 400 taken along the first direction A-A' of FIG. 3, illustrating an example of the pixel group.

The cross-sectional view 400 of a pixel group schematically illustrates a cross-sectional structure taken along the first direction A-A' in the pixel group illustrated in FIG. 3.

Where a semiconductor substrate 410 may have a frontside and a backside which face away from each other, the region illustrated in FIG. 4 may indicate the frontside. A pixel group may have a backside illumination type structure which receives incident light through a backside, and may have a frontside illumination type structure which receives incident light through a frontside.

The semiconductor substrate 410 may be formed of a p-type epitaxial layer, and the first and second photodiodes PD1 and PD2 and the floating diffusion FD are formed by n-type impurity layers doped into the semiconductor substrate 410.

Over a region between the first photodiode PD1 and the floating diffusion FD, the respective gates of the first transfer transistor TX1 and the common transfer transistor TXc may be disposed in series. The respective gates of the first transfer transistor TX1 and the common transfer transistor TXc may include gate electrodes to receive the first transfer control signal TG1 and the common transfer control signal TGc and gate dielectric layers to electrically isolate the respective gate electrodes and the semiconductor substrate 410. A gate isolation layer 420 may be disposed between the respective gate electrodes of the first transfer transistor TX1 and the common transfer transistor TXc, and thereby, the respective gate electrodes of the first transfer transistor TX1 and the common transfer transistor TXc may be electrically and physically isolated from each other. By way of example and not by limitation, the gate electrodes may include polysilicon and the gate dielectric layers and the gate isolation layer 420 may include oxide.

The first transfer transistor TX1 and the common transfer transistor TXc may be turned on by the first transfer control signal TG1 and the common transfer control signal TGc, respectively, and may transfer photocharges accumulated in the first photodiode PD1 to the floating diffusion FD through channels under the respective gate dielectric layers.

Over a region between the second photodiode PD2 and the floating diffusion FD, the respective gates of the second transfer transistor TX2 and the common transfer transistor TXc may be disposed in series. The respective gates of the second transfer transistor TX2 and the common transfer transistor TXc may include gate electrodes to receive the second transfer control signal TG2 and the common transfer control signal TGc and gate dielectric layers to electrically isolate the respective gate electrodes and the semiconductor substrate 410. A gate isolation layer 430 may be disposed between the respective gate electrodes of the second transfer transistor TX2 and the common transfer transistor TXc, and the respective gate electrodes of the second transfer transistor TX2 and the common transfer transistor TXc may be electrically and physically isolated from each other. By way of example and not by limitation, the gate electrodes may include polysilicon and the gate dielectric layers and the gate isolation layer 430 may include oxide.

The second transfer transistor TX2 and the common transfer transistor TXc may be turned on by the second transfer control signal TG2 and the common transfer control signal TGc, respectively, and may transfer photocharges accumulated in the second photodiode PD2, to the floating diffusion FD through channels under the respective gate dielectric layers.

Figure 5:
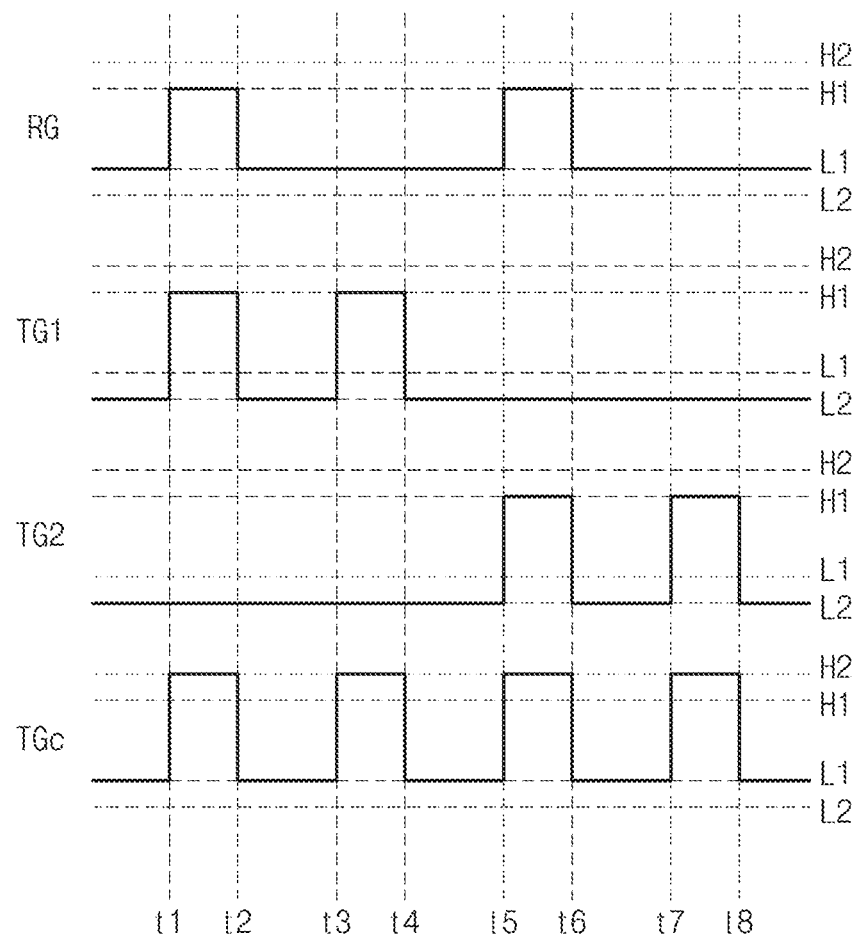
FIG. 5 is an example timing diagram showing how the pixel group illustrated in FIGS. 2 to 4 operates.
Figure 6:
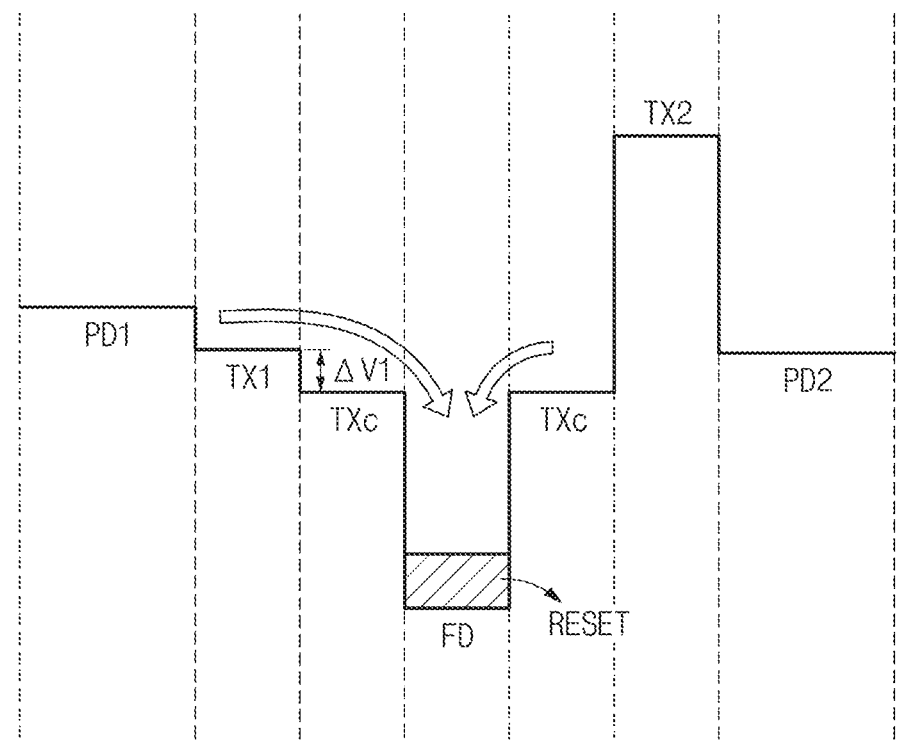
FIG. 6 illustrates voltage distributions of the pixel group in a first time period illustrated in FIG. 5.
Figure 7:
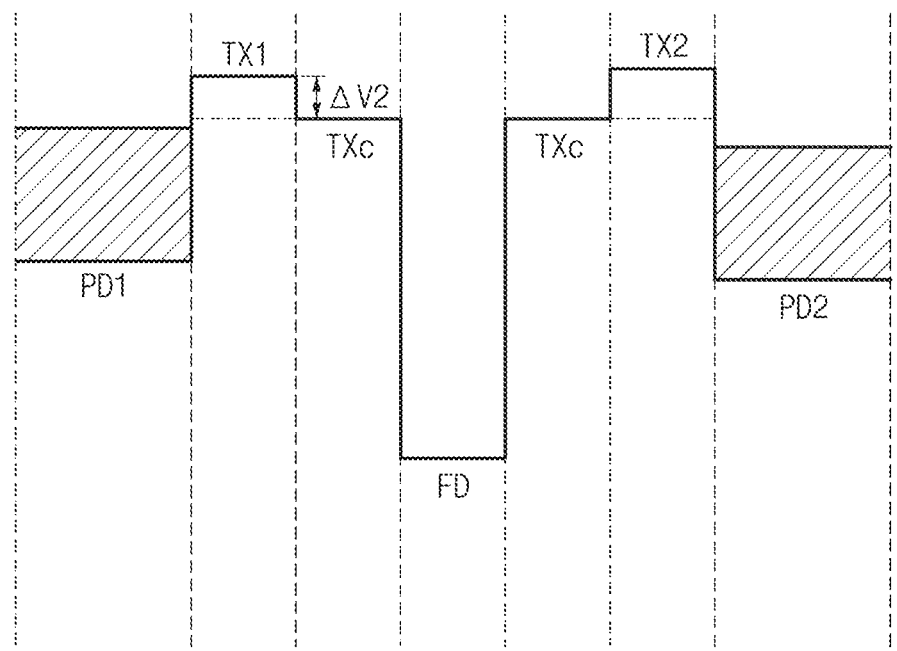
FIG. 7 illustrates voltage distributions of the pixel group in a second time period illustrated in FIG. 5.
Figure 8:
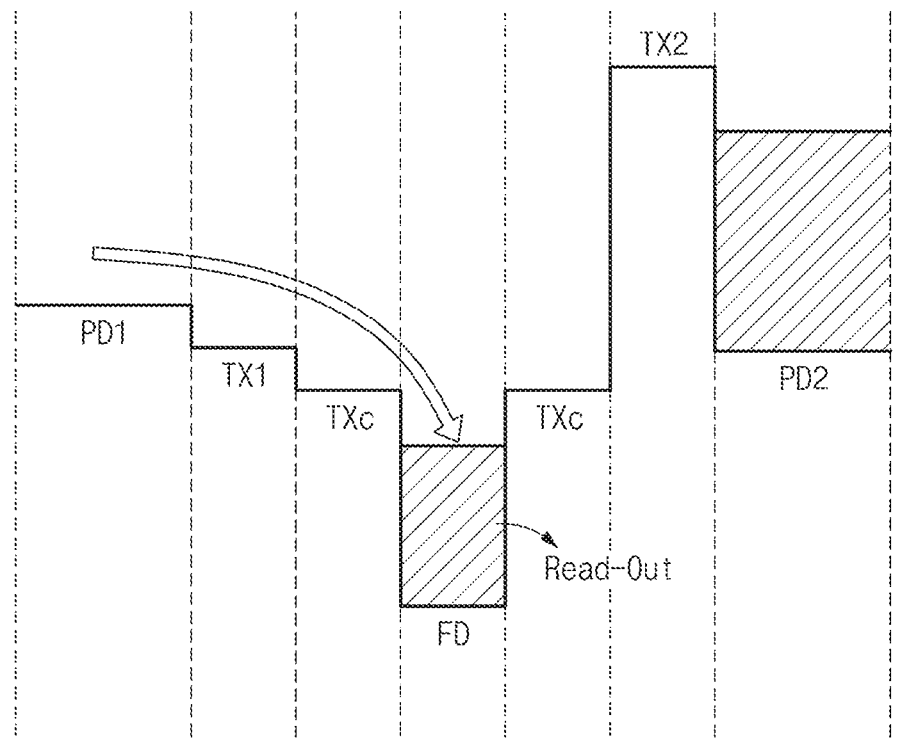
FIG. 8 illustrates voltage distributions of the pixel group in a third time period illustrated in FIG. 5

FIG. 5 is an example timing diagram showing how the pixel group illustrated in FIGS. 2 to 4 operate. FIGS. 6 to 8 are diagrams illustrating representations of examples of voltage distributions of the pixel group for time periods illustrated in FIG. 5.

Referring to FIG. 5, the control signals RG, TG1, TG2 and TGc are applied to the pixel group 200 to control the pixel group 200 described above with reference to FIGS. 2 to 4. Although control signals and timings for the reset, photocharge accumulation and photocharge transfer operations for the first and second photodiodes PD1 and PD2 are illustrated in FIG. 5 for the sake of convenience in explanation, the reset, photocharge accumulation and photocharge transfer operations for the third and fourth photodiodes PD3 and PD4 may also be sequentially performed in substantially the same manner as those for the first and second photodiodes PD1 and PD2.

Each of the control signals RG, TG1, TG2 and TGc may have a voltage level corresponding to any one of four logic levels H1, H2, L1 and L2. The first high level H1 is lower than the second high level H2, the first low level L1 is higher than the second low level L2, and the first high level H1 is higher than the first low level L1. Each of the transistors RX, TX1, TX2 and TXc may be turned on in the case where a signal of the high level H1 or H2 is applied to a corresponding gate, and may be turned off in the case where a signal of the low level L1 or L2 is applied to the corresponding gate.

The reset control signal RG is a signal that swings between the first high level H1 and the first low level L1. The first and second transfer control signals TG1 and TG2 are signals that swing between the first high level H1 and the second low level L2. The common transfer control signal TGc is a signal that swings between the second high level H2 and the first low level L1.

First, in a first period t1 to t2, each of the reset control signal RG, the first transfer control signal TG1 and the common transfer control signal TGc may have a high level, and the second transfer control signal TG2 may have a low level. Due to this fact, each of the reset transistor RX, the first transfer transistor TX1 and the common transfer transistor TXc may be turned on, and the second transfer transistor TX2 may be turned off.

FIG. 6 illustrates voltage distributions of the pixel group 200 in the first period t1 to t2. In FIG. 6, a vertical axis may indicate the voltage level at each region. If each transistor is turned off, the transistor may form a voltage difference barrier and thereby block transfer of charges between a source and a drain. If each transistor is turned on, electrical charges can be transferred between a source and a drain. The voltages at the first and second photodiodes PD1 and PD2 may be higher than the voltage level at the floating diffusion FD to have a predetermined voltage difference slope. By way of example and not by limitation, the voltages level at the first and second photodiodes PD1 and PD2 are the same as each other.

As each of the reset transistor RX, the first transfer transistor TX1 and the common transfer transistor TXc is turned on, photocharges existing in the first photodiode PD1, the first transfer transistor TX1 and the common transfer transistor TXc may be transferred to the floating diffusion FD, and the photocharges transferred to the floating diffusion FD may be drained to the power supply voltage VDD.

Since the turn-on voltages applied to the first transfer transistor TX1 and the common transfer transistor TXc have the first high level H1 and the second high level H2, respectively, a first voltage difference ΔV1 may be induced between the first transfer transistor TX1, which has a voltage level lower than the first photodiode PD1, and the common transfer transistor TXc, which has a voltage higher than the floating diffusion FD. The first voltage difference ΔV1 may be experimentally determined in consideration of transfer efficiency of photocharges from the first photodiode PD1 to the floating diffusion FD and prevention of overflow of photocharges transferred to the floating diffusion FD (or the photocharge accumulation capacity of the floating diffusion FD).

The first transfer transistor TX1 and the common transfer transistor TXc may provide a voltage difference slope that ramps down from the first photodiode PD1 to the floating diffusion FD. Therefore, due to such a voltage difference slope, the photocharges existing in the first photodiode PD1, the first transfer transistor TX1 and the common transfer transistor TXc may be effectively transferred to the floating diffusion FD.

Also, as the common transfer transistor TXc disposed to surround the perimeter of the floating diffusion region FD is turned on, the region including photocharges that can be a noise source (regions between FD and TX2 to TX4) may be reset together while not resetting the other photodiodes PD2 to PD4, in the pixel group structure, minimizing a potential noise source in a pixel signal.

Referring again to FIG. 5, in a second period t2 to t3, each of the reset control signal RG, the first and second transfer control signals TG1 and TG2 and the common transfer control signal TGc may have a low level, and thus each of the reset transistor RX, the first and second transfer transistors TX1 and TX2 and the common transfer transistor TXc may be turned off.

FIG. 7 illustrates voltage distributions of the pixel group 200 in the second period t2 to t3. In the state in which each of the reset transistor RX, the first and second transfer transistors TX1 and TX2 and the common transfer transistor TXc is turned off, an electrical signal corresponding to voltage lever at the floating diffusion FD may be outputted through the drive transistor DX and the selection transistor SX. This electrical signal may correspond to the reference signal described above with reference to FIG. 1.

Also, in the state in which each of the reset transistor RX, the first and second transfer transistors TX1 and TX2 and the common transfer transistor TXc is turned off, photocharges converted in correspondence to the intensity of incident light may be accumulated in each of the first and second photodiodes PD1 and PD2.

Since the turn-off voltages applied to the first transfer transistor TX1 and the common transfer transistor TXc have the second low level L2 and the first low level L1, respectively, a voltage difference by second voltage difference ΔV2 may be induced between the first transfer transistor TX1 and the common transfer transistor TXc which have voltage difference higher than the voltage difference of the first photodiode PD1. The second voltage difference ΔV2 may be experimentally determined in consideration of prevention of overflow of photocharges from the photodiodes PD1 to PD4 (or the photocharge accumulation capacity of the photodiodes PD1 to PD4) and power consumption optimization.

Due to such a voltage difference, it is possible to prevent photocharges accumulated in each of the first and second photodiodes PD1 and PD2 from overflowing to surrounding elements, and the sensitivity of each of the first and second photodiodes PD1 and PD2 may be further increased.

Referring again to FIG. 5, in a third period t3 to t4, each of the first transfer control signal TG1 and the common transfer control signal TGc may have a high level, and each of the reset control signal RG and the second transfer control signal TG2 may have a low level. Therefore, each of the first transfer transistor TX1 and the common transfer transistor TXc may be turned on, and each of the reset transistor RX and the second transfer transistor TX2 may be turned off.

FIG. 8 illustrates a voltage difference distribution of the pixel group 200 in the third period t3 to t4.

As each of the first transfer transistor TX1 and the common transfer transistor TXc is turned on and each of the reset transistor RX and the second transfer transistor TX2 is turned off, photocharges accumulated in the first photodiode PD1 may be transferred to and accumulated in the floating diffusion FD.

Since the turn-on voltages applied to the first transfer transistor TX1 and the common transfer transistor TXc have the first high level H1 and the second high level H2, respectively, a first voltage difference ΔV1 may be induced between the first transfer transistor TX1 and the common transfer transistor TXc, in the same manner as in FIG. 6.

Thus, the first transfer transistor TX1 and the common transfer transistor TXc may provide a voltage slope that ramps down from the first photodiode PD1 to the floating diffusion FD. Therefore, due to such a voltage slope, the photocharges accumulated in the first photodiode PD1 may be effectively transferred to the floating diffusion FD.

Referring again to FIG. 5, in a fourth period t4 to t5, each of the reset control signal RG, the first and second transfer control signals TG1 and TG2 and the common transfer control signal TGc may have a low level. Therefore, each of the reset transistor RX, the first and second transfer transistors TX1 and TX2 and the common transfer transistor TXc may be turned off. In the state in which each of the reset transistor RX, the first and second transfer transistors TX1 and TX2 and the common transfer transistor TXc is turned off, an electrical signal corresponding to voltage at the floating diffusion FD may be outputted through the drive transistor DX and the selection transistor SX (Read-Out of FIG. 8). This electrical signal may correspond to the image signal described above with reference to FIG. 1.

Thereafter, in a fifth period t5 to t6 to a seventh period t7 to t8, the reset, photocharge accumulation and photocharge transfer operations may be performed for the second photodiode PD2. Since detailed operations and voltage difference distributions in the fifth period t5 to t6 to the seventh period t7 to t8 correspond to the reset, photocharge accumulation and photocharge transfer operations for the first photodiode PD1 described above with reference to the first period t1 to t2 to the third period t3 to t4, repeated descriptions thereof will be omitted. For example, the voltage difference distributions in the fifth period t5 to t6 to the seventh period t7 to t8 may be bilaterally symmetrical to the voltage difference distributions in the first period t1 to t2 to the third period t3 to t4 described above with reference to FIGS. 6 to 8, about the floating diffusion FD.

Also, in a subsequent eighth period t8, an image signal corresponding to electrical voltage difference of the floating diffusion FD which receives photocharges accumulated by the second photodiode PD2 may be outputted through the drive transistor DX and the selection transistor SX.

Further, after the eighth period t8, reset, photocharge accumulation, photocharge transfer and readout operations for the third and fourth photodiodes PD3 and PD4 may be sequentially performed.

As described above with reference to FIG. 5, in a period for photocharge transfer to the floating diffusion FD such as the reset or photocharge transfer operation, by applying the second high level H2 higher than the first high level H1 to only the common transfer transistor TXc close to the floating diffusion FD, an appropriate voltage slope in the direction of the floating diffusion FD and power consumption reduction (e.g., the lower first high level H1 is applied to the first transfer transistor TX1) may be achieved.

Further, in a period in which photocharge transfer between the photodiodes PD1 to PD4 and the floating diffusion FD is blocked, such as the photocharge accumulation operation, by applying the second low level L2 lower than the first low level L1 to only the transfer transistors TX1 to TX4 close to the photodiodes PD1 to PD4, it is possible to prevent photocharges accumulated in the photodiodes PD1 to PD4 from overflowing, and power consumption reduction (the higher first low level L1 is applied to the common transfer transistor TXc) may be achieved.

If a transfer transistor is a single transistor, in order for an appropriate voltage slope in the direction of the floating diffusion FD and prevention of an overflow phenomenon of photocharges, the single transistor needs to swing between the second low level L2 and the second high level H2. However, in the case where double transfer transistors are implemented as in the embodiments of the disclosed technology, an appropriate voltage slope in the direction of the floating diffusion FD and prevention of an overflow phenomenon of photocharges may be achieved in the same manner even if the respective transfer transistors TX1 to TX4 and TXc have a relatively narrow swing width L2 to H1 or L1 to H2 In this way, it is possible to alleviate the burden of hot carrier infection and improve the reliability of a pixel operation.

In a pixel based on the embodiments of the disclosure, by dividing a transfer transistor performing photocharge transfer between a photodiode and a floating diffusion, into two transfer transistors, and by independently controlling bias voltages to be applied to the respective transfer transistors, pixel operation characteristics may be improved when resetting the floating diffusion, accumulating photocharges and transferring photocharges to the floating diffusion, the noise of a pixel signal may be reduced and power consumption may be minimized.

Figure 9:
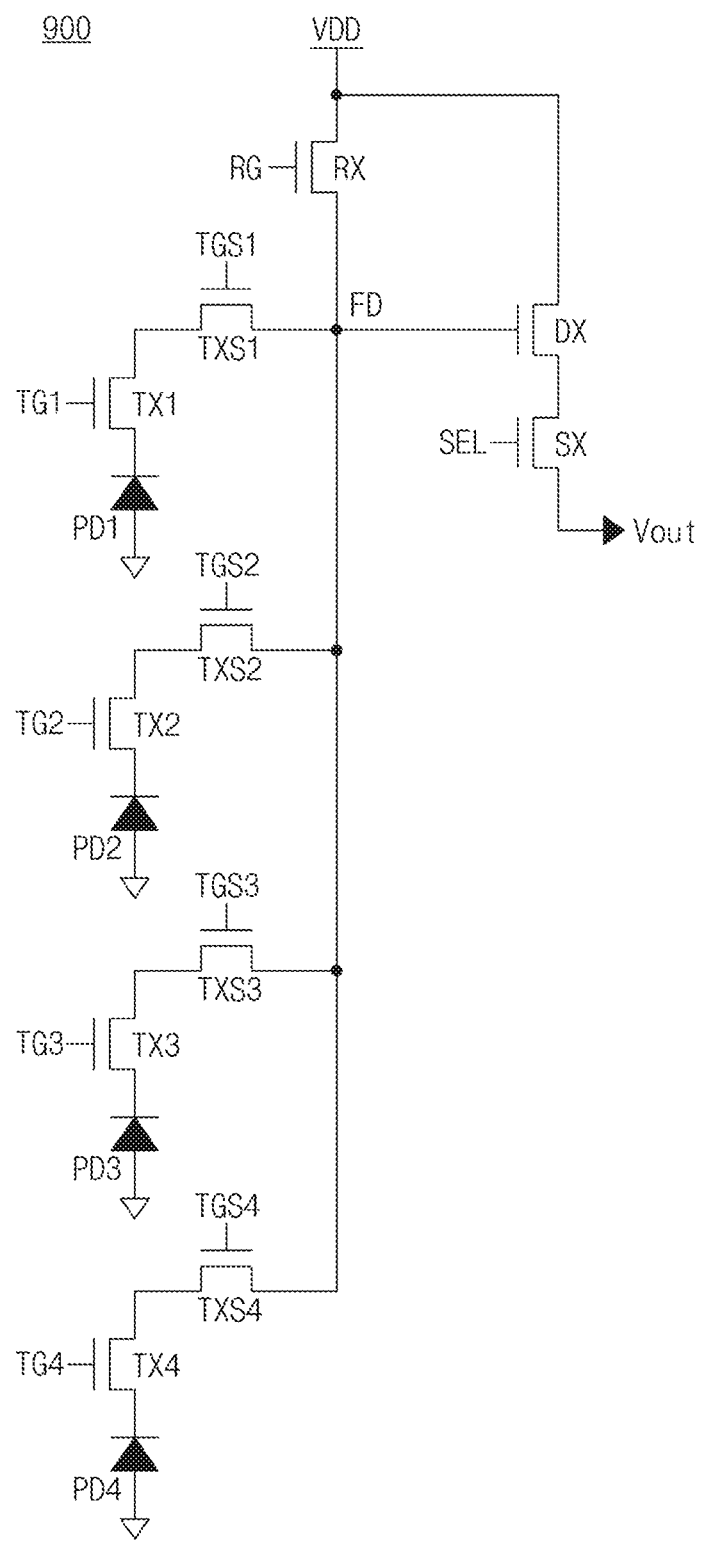
FIG. 9 illustrates another example of a pixel group that is shared by a set of unit pixels included in the pixel array illustrated in FIG. 1.

FIG. 9 illustrates another example of a pixel group that is shared by a set of pixels included in the pixel array illustrated in FIG. 1.

Referring to FIG. 9, a pixel group 900 may include four unit pixels UP illustrated in FIG. 1. That is to say, the pixel group 900 may include four unit pixels UP that shares common elements. Thus, the respective four unit pixels UP have independent photodiodes PD1 to PD4, transfer transistors TX1 to TX4 and sub transfer transistors TXS1 to TXS4, but the remaining elements are structured to be shared by the four unit pixels UP.

By way of example and not by limitation, the pixel group 900 may include first to fourth photodiodes PD1 to PD4, first to fourth transfer transistors TX1 to TX4, first to fourth sub transfer transistors TXS1 to TXS4, a floating diffusion FD, a reset transistor RX, a drive transistor DX, and a selection transistor SX.

Since the components except the first to fourth sub transfer transistors TXS1 to TXS4 are substantially the same as the corresponding components of FIG. 2, detailed descriptions thereof will be omitted.

The respective first to fourth sub transfer transistors TXS1 to TXS4 may be coupled in series between the respective first to fourth transfer transistors TX1 to TX4 and the floating diffusion FD. The first to fourth sub transfer transistors TXS1 to TXS4 may be turned on or off in response to first to fourth sub transfer control signals TGS1 to TGS4, respectively, and the respective turned-on first to fourth sub transfer transistors TXS1 to TXS4 may transfer photocharges transferred from the respective first to fourth transfer transistors TX1 to TX4, to the floating diffusion FD.

Figure 10:
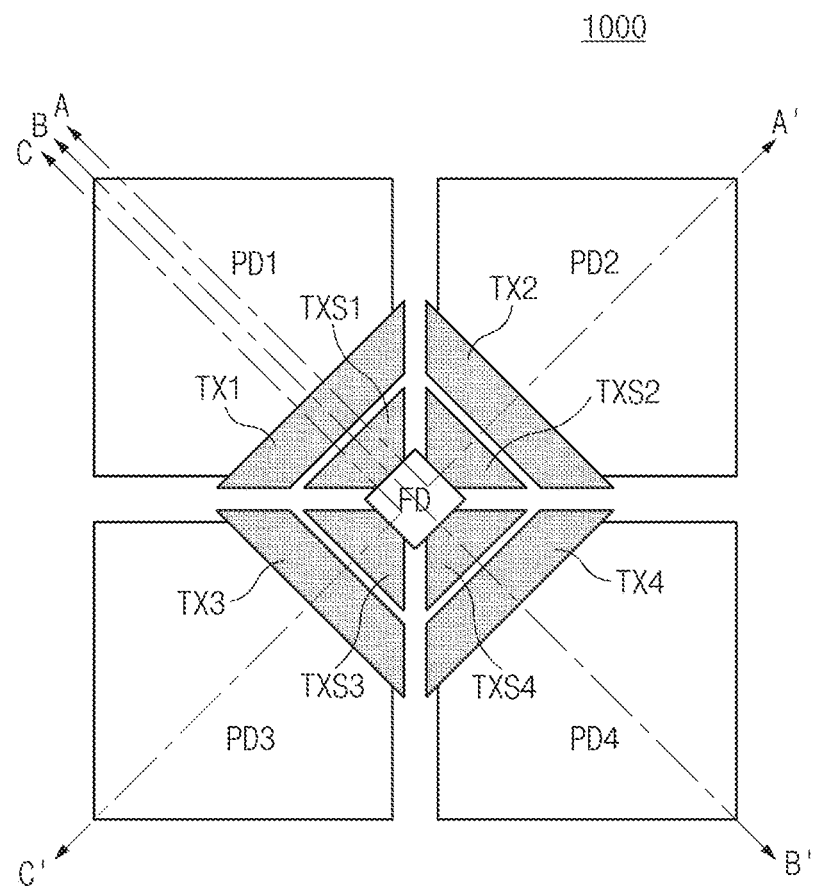
FIG. 10 is another example layout of the pixel group illustrated in FIG. 9.

FIG. 10 is another example layout of the pixel group illustrated in FIG. 9.

Referring to FIG. 10, a pixel group 1000 includes four unit pixels UP configuring the pixel group 900 illustrated in FIG. 9.

While the four unit pixels (e.g., four photodiodes and four transfer transistors) illustrated in FIG. 10 are arranged in the form of a 2×2 matrix, they can be arranged in different ways such as 1×4 or 4×1 matrix.

The floating diffusion FD may be disposed at the center between the four unit pixels, and the first to fourth sub transfer transistors TXS1 to TXS4 may be disposed to surround the perimeter of the floating diffusion FD. When compared to the common transfer transistor TXc of FIG. 3, the common transfer transistor TXc has a shape in which physically one element surrounds the perimeter of the floating diffusion FD, whereas the first to fourth sub transfer transistors TXS1 to TXS4 may be disposed in a shape in which independent four elements physically separated from one another surround the perimeter of the floating diffusion FD.

The first to fourth sub transfer transistors TXS1 to TXS4 may correspond to another embodiment of the common transfer transistor TXc, and may be collectively referred to as a common transfer transistor.

Between the respective first to fourth sub transfer transistors TXS1 to TXS4 and the respective photodiodes PD1 to PD4, the respective transfer transistors TX1 to TX4 may be disposed to extend along the respective first to fourth sub transfer transistors TXS1 to TXS4.

At least a portion of each of the photodiodes PD1 to PD4 may be exposed to increase light reception efficiency, and the other elements RX, DX and SX not illustrated in FIG. 10 may be disposed in the upper, lower, left and/or right peripheral region (not illustrated) of the photodiodes PD1 to PD4.

By way of example and not by limitation, the respective photodiodes PD1 to PD4 and the respective transfer transistors TX1 to TX4 or the respective sub transfer transistors TXS1 to TXS4 and the floating diffusion FD may at least partially overlap with each other.

Three directions A-A', B-B' and C-C' are illustrated in FIG. 10. The respective directions A-A', B-B' and C-C' indicate directions that extend from the first photodiode PD1 through the floating diffusion FD to the second to fourth photodiodes PD2 to PD4, respectively. Since cross-sections corresponding to the respective directions A-A', B-B' and C-C' are substantially the same as the cross-section along the first direction A-A' described above with reference to FIG. 4 except that the common transfer transistor TXc is replaced with the first and second sub transfer transistors TXS1 and TXS2 at corresponding positions, detailed descriptions thereof will be omitted.

The respective first to fourth sub transfer transistors TXS1 to TXS4 receive the same signals as the common transfer control signal TGc described above, as the first to fourth sub transfer control signals TGS1 to TGS4, and may operate at the same timings as the common transfer transistor TXc.

In another embodiment of the disclosed technology, the entire waveforms of the respective first to fourth sub transfer control signals TGS1 to TGS4 may be the same as the waveform of the common transfer control signal TGc, but, in a period (e.g., the third period t3 to t4 of FIG. 5) in which photocharges accumulated in a specific photodiode (e.g., PD1) are transferred to the floating diffusion FD, only a sub transfer control signal (e.g., TGS1) corresponding to the specific photodiode PD1 may have a high level and sub transfer control signals (e.g., TGS2 to TGS4) corresponding to the remaining photodiodes PD2 to PD4 may have a low level. In this way, it is possible to prevent photocharges transferred from the specific photodiode PD1 to the floating diffusion FD from diffusing to another region, and prevent photocharges existing in another region from being transferred to the floating diffusion FD.

an image sensing device that includes a common transfer transistor coupled between four transfer transistors and the corresponding floating diffusion region to effectively transfer the photo-charges to the floating diffusion region While a 4-pixel group is described as an example in the present specification, the scope of the disclosure is not limited thereto, and substantially the same technical concept may be applied even to the case where an optional number of unit pixels configure a pixel group or not in the case of a pixel group.

What is claimed is:

1. An image sensor, comprising:
a pixel group comprising:
a plurality of photodiodes configured to produce photocharges in response to light incident on the plurality of photodiodes;
a floating diffusion region configured to receive and accumulate the photocharges produced by the plurality of photodiodes;
a plurality of transfer transistors coupled to the plurality of photodiodes, respectively, each of the plurality of transfer transistors configured to transfer the photocharges produced by the corresponding photodiode; and
a common transfer transistor coupled between the plurality of transfer transistors and the floating diffusion region and configured to transfer the photocharges produced by the plurality of photodiodes to the floating diffusion region,
wherein, to enable a reset operation for one of the plurality of photodiodes, one of the plurality of transfer transistors corresponding to the one of the plurality of photodiodes is configured to receive a first transfer control signal at a first logic high level, and the common transfer transistor is configured to receive a common transfer control signal at a second logic high level, and wherein the second logic high level is higher than the first logic high level, and
wherein, to enable the reset operation for the one of the plurality of photodiodes, the common transfer transistor is configured to transfer, to the floating diffusion region, photocharges existing between the floating diffusion region and transfer transistors except for the one of the plurality of transfer transistors corresponding to the one of the plurality of photodiodes.

2. The image sensor according to claim 1, wherein the floating diffusion region is disposed at a center portion of the plurality of photodiodes.

3. The image sensor according to claim 1, wherein the common transfer transistor is ring shaped and surrounds the floating diffusion region.

4. The image sensor according to claim 1, wherein the common transfer transistor comprises a plurality of sub transfer transistors disposed to surround the floating diffusion region.

5. The image sensor according to claim 1, wherein a gate electrode of the common transfer transistor is electrically isolated from gate electrodes of the respective transfer transistors.

6. The image sensor according to claim 1, wherein the common transfer transistor is configured to receive a first logic low level voltage and the plurality of transfer transistors is configured to receive a second logic low level voltage to the floating diffusion region, and wherein the first logic low level voltage is different from the second logic low level voltage.

7. The image sensor according to claim 1, wherein the common transfer transistor is configured to receive a first logic high level voltage and the plurality of transfer transistors is configured to receive a second logic high level voltage, and wherein the first logic high level voltage is different from the second logic high level voltage.

8. The image sensor according to claim 1, wherein, to enable the reset operation for the one of the plurality of photodiodes, the one of the plurality of transfer transistors corresponding to the one of the plurality of photodiodes is configured to have a first voltage lower than the one of the plurality of photodiodes and the common transfer transistor is configured to have a second voltage higher than the floating diffusion region, and wherein the first voltage is different from the second voltage.

9. The image sensor according to claim 8, wherein the voltage difference between the first voltage and the second voltage is determined based on photocharge accumulation capacity of the floating diffusion region.

10. The image sensor according to claim 1, wherein, to enable a photocharge accumulation operation for the one of the plurality of photodiodes, the one of the plurality of transfer transistors corresponding to the one of the plurality of photodiodes is configured to receive the first transfer control signal at a second logic low level, and the common transfer transistor is configured to receive the common transfer control signal at a first logic low level higher than the second logic low level.

11. The image sensor according to claim 10, wherein, in the photocharge accumulation operation for the one of the plurality of photodiodes, a voltage at the one of the plurality of transfer transistors corresponding to the one of the plurality of photodiodes is different from a voltage at the common transfer transistor higher than the one of the plurality of photodiodes.

12. The image sensor according to claim 11, wherein the voltage difference between the one of the plurality of transfer transistors corresponding to the one of the plurality of photodiodes and the common transfer transistor is determined based on photocharge accumulation capacity of the one of the plurality of photodiodes.

13. The image sensor according to claim 1, wherein, to enable a photocharge transfer operation for one of the plurality of photodiodes, the one of the plurality of transfer transistors corresponding to the one of the plurality of photodiodes is configured to receive the first transfer control signal at a first logic high level, and the common transfer transistor is configured to receive the common transfer control signal at the second logic high level higher than the first logic high level.

14. The image sensor according to claim 1, wherein the pixel group comprises first to fourth unit pixels disposed in 2×2 matrix, and wherein each unit pixel includes one of the plurality of photodiodes and one of the plurality of transfer transistors.

15. The image sensor according to claim 14, wherein the first to fourth unit pixels share a reset transistor, a drive transistor and a selection transistor.

16. An image sensor, comprising:
a pixel group comprising:
first to fourth photodiodes configured to produce photocharges in response to light incident thereon;
first to fourth transfer transistors configured to transfer photocharges accumulated in the first to fourth photodiodes, respectively; and
a common transfer transistor coupled between the first to fourth transfer transistors and a floating diffusion region, and configured to transfer the photocharges to the floating diffusion region,
wherein a logic low level voltage or a logic high level voltage applied to the first to fourth transfer transistors to turn on or off the first to fourth transfer transistors is different from a logic low level voltage or a logic high level voltage applied to the common transfer transistor to turn on or off the common transfer voltage,
wherein, to enable a reset operation for one of the first to fourth photodiodes, one of the first to fourth transfer transistors corresponding to the one of the plurality of photodiodes is configured to receive a first transfer control signal at a first logic high level, and the common transfer transistor is configured to receive a common transfer control signal at a second logic high level, and wherein the second logic high level is higher than the first logic high level, and
wherein, to enable the reset operation for the one of the first to fourth photodiodes, the common transfer transistor is configured to transfer, to the floating diffusion region, photocharges existing between the floating diffusion region and transfer transistors except for the one of the first to fourth transfer transistors corresponding to the one of the first to fourth photodiodes.

17. The image sensor according to claim 16, wherein, to enable the reset operation for the one of the first to fourth photodiodes, the one of the first to fourth transfer transistors corresponding to the one of the first to fourth photodiodes is configured to receive a first transfer control signal at a first logic high level, and the common transfer transistor is configured to receive a common transfer control signal at a second logic high level higher than the first logic high level.

18. The image sensor according to claim 16, wherein, to enable a photocharge accumulation operation for the one of the first to fourth photodiodes, the one of the first to fourth transfer transistors corresponding to the one of the first to fourth photodiodes is configured to receive the first transfer control signal at a second logic low level, and the common transfer transistor is configured to receive the common transfer control signal at a first logic low level higher than the second logic low level.

19. An image sensor, comprising:
a pixel array including a pixel group including first to fourth unit pixels; and
a row decoder configured to drive the pixel array,
wherein the first unit pixel comprises a first transfer transistor and a common transfer transistor which are coupled between a first photodiode that is configured to accumulate photocharges in correspondence to an intensity of incident light and a floating diffusion region,
wherein, to enable a reset operation for the first photodiode, the first transfer transistor is configured to receive a first transfer control signal at a first logic high level, and the common transfer transistor is configured to receive a common transfer control signal at a second logic high level, and wherein the second logic high level is higher than the first logic high level, and
wherein, to enable the reset operation for the first photodiode, the common transfer transistor is configured to transfer, to the floating diffusion region, photocharges existing between the floating diffusion region and transfer transistors corresponding to second to fourth photodiodes included in the second to fourth unit pixels.

* * * * *